(12) United States Patent
Yang

(10) Patent No.: US 7,611,946 B2
(45) Date of Patent: Nov. 3, 2009

(54) METHOD OF FABRICATING A NON-VOLATILE MEMORY DEVICE

(75) Inventor: In Kwon Yang, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/163,953

(22) Filed: Jun. 27, 2008

(65) Prior Publication Data
US 2009/0098700 A1 Apr. 16, 2009

(30) Foreign Application Priority Data
Oct. 10, 2007 (KR) .............................. 2007-102109

(51) Int. Cl.
*H01L 21/336* (2006.01)
(52) U.S. Cl. ................ 438/257; 257/314; 257/E29.255
(58) Field of Classification Search .................. 438/257, 438/264, 275, 279; 257/365, 316, 319, 314, 257/E29.255, E29.3
See application file for complete search history.

(56) References Cited

U.S. PATENT DOCUMENTS

| | | | |
|---|---|---|---|
| 6,940,114 B2 | 9/2005 | Oh et al. | |
| 7,091,544 B2 | 8/2006 | Hon et al. | |
| 2004/0085830 A1* | 5/2004 | Schneider et al. | ............ 365/200 |
| 2005/0218460 A1* | 10/2005 | Hasegawa et al. | ........... 257/390 |
| 2008/0054341 A1* | 3/2008 | Natori et al. | ................ 257/316 |

FOREIGN PATENT DOCUMENTS

| KR | 100645065 B1 | 11/2006 |
|---|---|---|
| KR | 1020070001687 A | 1/2007 |

* cited by examiner

*Primary Examiner*—Matthew Smith
*Assistant Examiner*—Michele Fan
(74) *Attorney, Agent, or Firm*—Townsend and Townsend and Crew LLP

(57) ABSTRACT

A method of fabricating a non-volatile memory device prevents the threshold voltage of a program-inhibited cell from rising by preventing hot carriers, generated in a semiconductor substrate near a select line, from being injected into a floating gate of the program-inhibited cell. The program-inhibited cell shares a word line adjacent to the select line such that a trench is formed in the semiconductor substrate between the select line and the adjacent word line to increase a distance between the select line and the word line.

13 Claims, 4 Drawing Sheets

METHOD OF FABRICATING A NON-VOLATILE MEMORY DEVICE

CROSS-REFERENCES TO RELATED APPLICATIONS

The present application claims priority to Korean patent application number 10-2007-0102109, filed on Oct. 10, 2007, which is incorporated by reference in its entirety.

BACKGROUND OF THE INVENTION

The present invention relates to a method of fabricating non-volatile memory devices and, more particularly, to a method of fabricating NAND flash memory devices.

Generally, semiconductor memory devices can be classified into volatile memory devices and non-volatile memory devices. Volatile memory devices, such as Dynamic Random Access Memory (DRAM) and Static Random Access Memory (SRAM), exhibit high speed data input/output characteristics, but lose their data when power is turned off. Non-volatile memory devices retain their data even when power is turned off.

A flash memory device is a kind of a non-volatile memory device. A flash memory device is a high-integrated memory device, which was developed by taking advantage of Erasable Programmable Read Only Memory (EPROM) that can be programmed and erased, and Electrically Erasable Programmable Read Only Memory (EEPROM) that can be electrically programmed and erased. The term 'program' refers to an operation of writing data into a memory cell, and the term 'erase' refers to an operation of deleting data written into a memory cell.

A flash memory device can be categorized as NOR type and NAND type flash memory devices according to the structure and operating condition of a cell. In the NOR type flash memory device, the drain of each memory cell transistor is coupled to a bit line, enabling program and erase operations with respect to a specific address and, therefore, increasing the operating speed. The NOR type flash memory device is generally used in applications requiring a high-speed operation. In contrast, in the NAND type flash memory device, a plurality of memory cell transistors is connected in series, constituting one string, and one string is coupled between bit lines and a common source line. Thus, the NAND type flash memory device has a relatively small number of drain contact plugs, facilitating high integration. Accordingly, the NAND type flash memory device is generally used in applications requiring high-capacity data retention.

The NAND type flash memory device includes a plurality of word lines formed between a source select line and a drain select line. A select line, for example, the source select line or the drain select line, is formed by connecting gates of select transistors, each included in a plurality of strings. The word lines are formed by connecting gates of memory cell transistors. The select line and the word line include a tunnel oxide layer, a floating gate, a dielectric layer and a control gate. In the select line, the floating gate and the control gate are electrically connected.

In order to program the NAND flash memory, electrons pass through the tunnel insulating layer by the F-N tunneling effect, so that the electrons from the semiconductor substrate are stored in the floating gate and electrons stored in the floating gate are drained toward the semiconductor substrate. A high voltage is applied to a memory cell to be programmed and the semiconductor substrate is grounded to produce a bias difference. Accordingly, electrons in the channel area of the semiconductor substrate pass through the tunnel insulating layer and then tunnel through the floating gate of the corresponding memory cell. The electrons are trapped at the floating gate of the corresponding memory cell, which is thereby programmed.

However, the same high voltage is applied to other memory cells sharing the word line of the programmed memory cell. Thus, the other memory cells sharing the word line may be programmed unintentionally. In order to solve this problem, a channel area of the other memory cells sharing the word line is boosted to maintain a constant voltage. Accordingly, a potential difference between the other memory cells sharing the word line and the channel area can be reduced to prevent a program operation.

However, if the channel area of a word line adjacent to the select line is boosted, when 0V is applied to the select line, a Gate Induced Drain Leakage (GIDL) current is generated in a section where the select line and the junction overlap, thereby generating electrons. The generated electrons rapidly move to the channel area and serve as hot carriers due to a program voltage applied to the word line adjacent to the select line, so that the electrons move to the floating gate. For this reason, a phenomenon in which the word line adjacent to the select line is unintentionally programmed can occur.

BRIEF SUMMARY OF THE INVENTION

The present invention is directed to prevent the threshold voltage of a program-inhibited cell from rising by preventing hot carriers, generated in a semiconductor substrate near a select line, from being injected into a floating gate of the program-inhibited cell. The program-inhibited cell shares a word line adjacent to the select line such that a trench is formed in the semiconductor substrate between the select line and the adjacent word line to increase a distance between the select line and the word line.

According to a method of fabricating a non-volatile memory device in accordance with an aspect of the present invention, a semiconductor substrate in which a tunnel insulating layer, a first conductive layer and a dielectric layer are formed on an active area is provided. A first contact hole is formed by removing a portion of the dielectric layer. The first contact hole is formed in an area in which a select line is to be formed. A second contact hole is formed by removing a portion of the dielectric layer between areas in which the select line and a word line adjacent to the select line are to be formed. A second conductive layer is formed on the dielectric layer, and fills the first contact hole and the second contact hole. The second conductive layer is patterned using a first etch process. The exposed portion of the dielectric layer is removed using a second etch process. A trench is formed in the semiconductor substrate of an area corresponding to the second contact hole. The trench is formed while removing the exposed portion of the first conductive layer using a third etch process.

The first etch process may be performed to etch the dielectric layer less than the second conductive layer. The first etch process may be performed using an etch selectivity of the second conductive layer relative to the dielectric layer, which ranges from 5:1 to 20:1. During the first etch process, the first conductive layer exposed below the second contact hole may also be removed. A thickness of the first conductive layer remaining below the second contact hole after the first etch process may be be 0 to 70% of a total thickness of the first conductive layer. The tunnel insulating layer formed below the first conductive layer may be exposed by the second etch process. The second etch process may be performed using an etch selectivity of the first conductive layer relative to the dielectric layer, which ranges from 1:1 to 1.5:1. The trench can have a depth ranging from 100 to 300 angstroms. An ion implantation process may be further performed on the semiconductor substrate between the select line and the word line, which may be formed after the third etch. A spacer material layer may be further formed between the select line and the word line formed after the third etch process. The spacer material layer may be etched to form a spacer on sidewalls of the select line. In the process of etching the spacer material layer, a depth of the trench may be increased by 50 to 200 angstroms.

DESCRIPTION OF SPECIFIC EMBODIMENT

A specific embodiment according to the present invention will be described with reference to the accompanying drawings. However, the present invention is not limited to the disclosed embodiment, but may be implemented in various ways. The embodiment is provided to complete the disclosure of the present invention and to allow those having ordinary skill in the art to understand the present invention. The present invention is defined by the scope of the claims.

FIGS. 1A to 1I are cross-sectional views illustrating a method of fabricating a non-volatile memory device in accordance with the present invention.

Figure 1A:
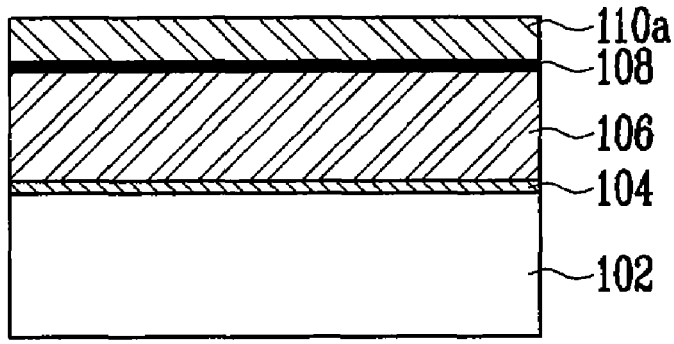
FIGS. 1A to 1I are cross-sectional views illustrating a method of fabricating a non-volatile memory device in accordance with the present invention.

Referring to FIG. 1A, a screen oxide layer (not shown) is formed on a semiconductor substrate 102. A well ion implantation process or a threshold voltage ion implantation process is performed on the semiconductor substrate 102. The well ion implantation process is performed to form well areas in the semiconductor substrate 102, and the threshold voltage ion implantation process is performed to control the threshold voltage of a semiconductor element such as a transistor. The screen oxide layer (not shown) prevents the surface of the semiconductor substrate 102 from being damaged during the well ion implantation process or the threshold voltage ion implantation process. Accordingly, the well areas (not shown) are formed in the semiconductor substrate 102, and the well area may have a triple structure.

After the screen oxide layer (not shown) is removed, a tunnel insulating layer 104 is formed on the semiconductor substrate 102 to fabricate a NAND flash device. The tunnel insulating layer 104 may have electrons pass therethrough by Fowler/Nordheim (F/N) tunneling. Accordingly, electrons may pass from a channel area formed under the tunnel insulating layer 104 to a floating gate formed over the tunnel insulating layer 104. The tunnel insulating layer 104 may be an oxide layer.

A first conductive layer 106 for the floating gate is formed on the tunnel insulating layer 104. During a program operation, electrons from the semiconductor substrate 102 through the tunnel insulating layer 104 may be trapped and programmed at the first conductive layer 106. During an erase operation, charges stored in the first conductive layer 106 may be discharged toward the semiconductor substrate 102 through the tunnel insulating layer 104. The first conductive layer 106 may be formed from polysilicon.

Although not shown in the drawing, the first conductive layer 106 and the tunnel insulating layer 104 formed on an isolation area of the semiconductor substrate 102 are removed, and the semiconductor substrate 102 is partially removed, thereby forming trenches. The trenches are gap-filled with an insulating material, for example, an oxide layer to form isolation layers (not shown).

A dielectric layer 108 is formed on the first conductive layer 106. The dielectric layer 108 may have a stacked structure of an oxide layer/a nitride layer/an oxide layer (ONO). A second conductive layer 110a is formed on the dielectric layer 108. The second conductive layer 110a may protect the dielectric layer 108 when the dielectric layer 108 is etched. The second conductive layer 110a may also be used as a part of a control gate formed on the dielectric layer 108 in a subsequent process. The second conductive layer 110a may be formed from polysilicon.

Figure 1B:
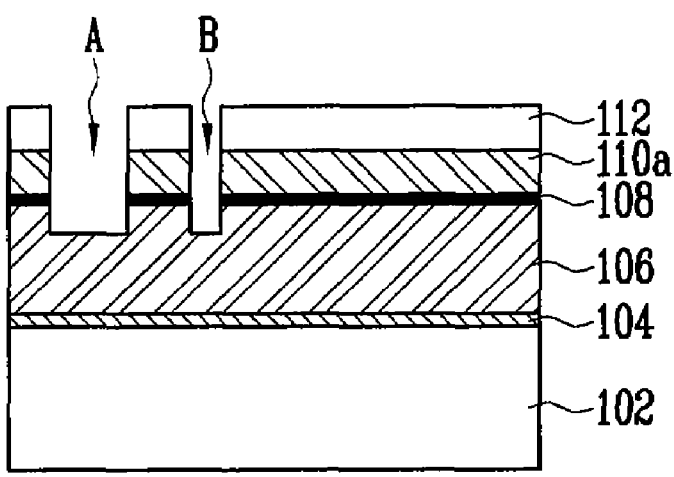

Referring to FIG. 1B, a mask pattern 112 is formed on the second conductive layer 110a. The mask pattern 112 includes patterns for forming a first contact hole A in the dielectric layer 108 of a select transistor, which is formed in select lines such as drain select lines or source select lines, and forming a second contact hole B in the dielectric layer 108 between a select line and a word line adjacent to the select line, which are formed in a subsequent process. The second contact hole B may have a width which is identical to or narrower than a distance between the select line and the word line. The second conductive layer 110a and the dielectric layer 108 are etched by performing an etch process employing the mask pattern 112, thereby completing the formation of the first contact hole A and the second contact hole B. The etch process may be performed using an isotropic dry etch process. During the etch process, a portion of the first conductive layer 106 may also be etched.

Figure 1C:
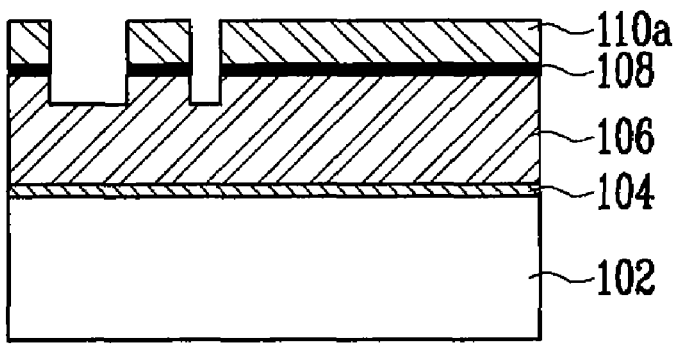

Referring to FIG. 1C, the mask pattern (refer to 112 of FIG. 1B) is removed.

Figure 1D:
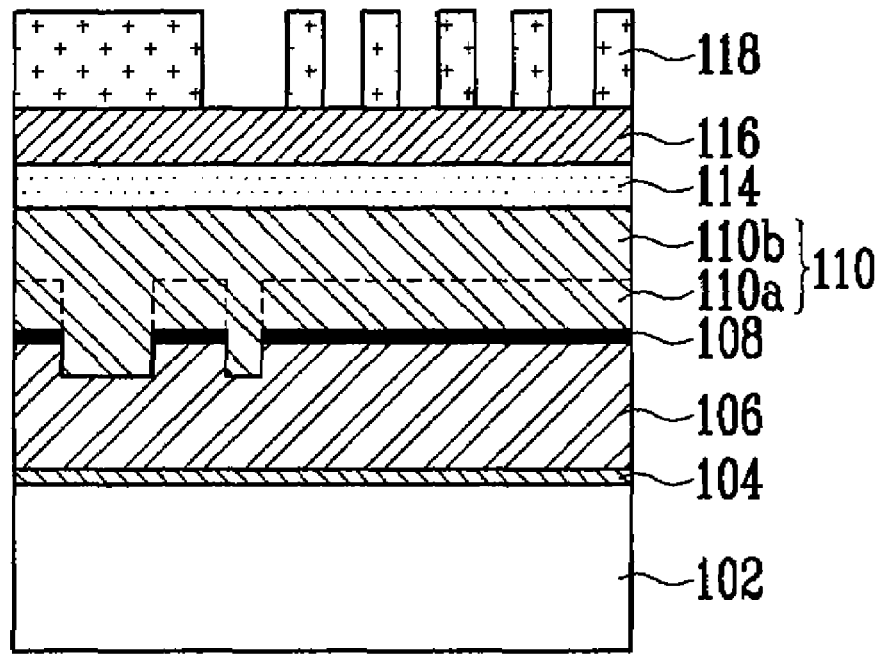

Referring to FIG. 1D, a third conductive layer 110b for the control gate is formed on the second conductive layer 110a. The third conductive layer 110b contacts the first conductive layer 106 through the first contact hole A and the second contact hole B between an area where the select line is formed and an area where the select line and the word line are formed. The third conductive layer 110b may combine with the second conductive layer 110a, thereby forming a conductive layer 110 for the control gate. The third conductive layer 110b may be formed from polysilicon.

A gate electrode layer 114 is formed on the conductive layer 110 for the control gate. The gate electrode layer 114 may be formed of a metal material having low resistance, for example, tungsten silicide, so as to reduce electrical resistance of a gate. A hard mask 116 is formed on the gate electrode layer 114. The hard mask 116 may be an insulating layer, for example, a nitride layer. Gate mask patterns 118 are formed on the hard mask 116. The gate mask patterns 118 are used in a gate etch process for patterning the select lines and the word lines.

Figure 1E:
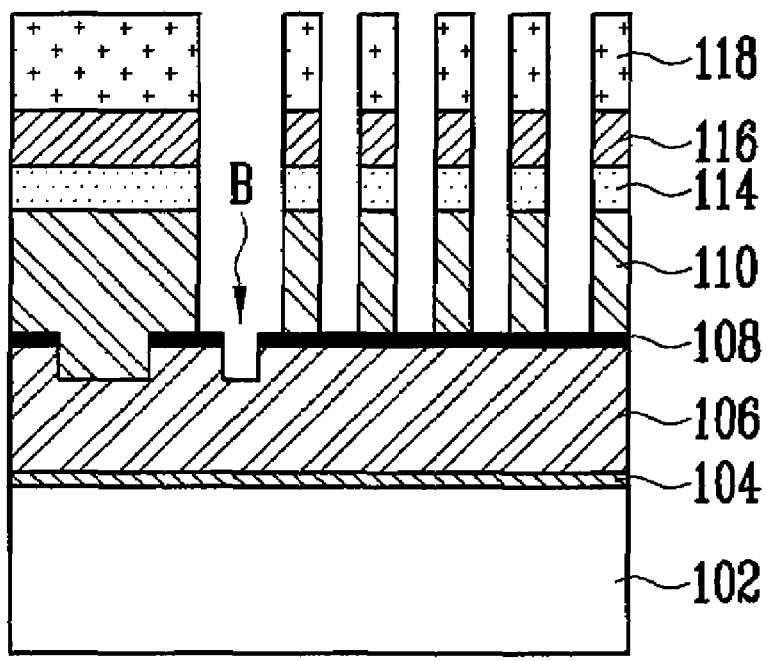

Referring to FIG. 1E, the hard mask 116, the gate electrode layer 114, and the conductive layer 110 for the control gate are patterned by a first etch process employing the gate mask patterns 118. The first etch process may be performed using an isotropic dry etch process. The first etch process may be performed under conditions in which the dielectric layer 108 is etched less than patterned layers. For example, the etch selectivity of the conductive layer 110 for the control gate relative to the dielectric layer 108 may range from 5:1 to 20:1. Accordingly, a portion of the dielectric layer 108 exposed by the first etch process is not etched further. However, the second contact hole B is formed in the dielectric layer 108 by the above process. Accordingly, the exposed first conductive layer 106 may be etched entirely or partially during the first etch process at a portion where the dielectric layer 108 does not exist. After the first etch process, a thickness of the first conductive layer 106, remaining below the second contact hole B, may be 0 to 70% of a total thickness of the first conductive layer 106.

Figure 1F:
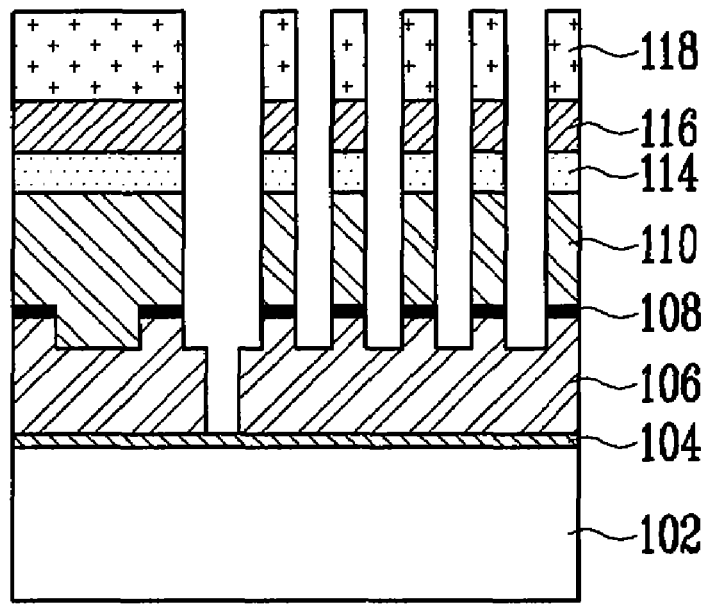

Referring to FIG. 1F, patterning is performed up to the conductive layer 110 for the control gate by the first etch process. The dielectric layer 108, exposed between the conductive layers 110 for the control gate, is removed and patterned using a second etch process. The second etch process may be performed using an isotropic dry etch process. The second etch process may be performed under conditions in which the dielectric layer 108 and the first conductive layer 106 are removed to a similar degree. For example, the etch selectivity of the first conductive layer 106 relative to the dielectric layer 108 may range from 1:1 to 1.5:1. Due to this, a portion of the first conductive layer 106, which is exposed while removing the dielectric layer 108 in the second etch process, may also be removed. In particular, the first conductive layer 106 in the area where the second contact hole (refer to B of FIG. 1E) is formed in the dielectric layer 108 is removed in the second etch process, thereby exposing the tunnel insulating layer 104.

Figure 1G:
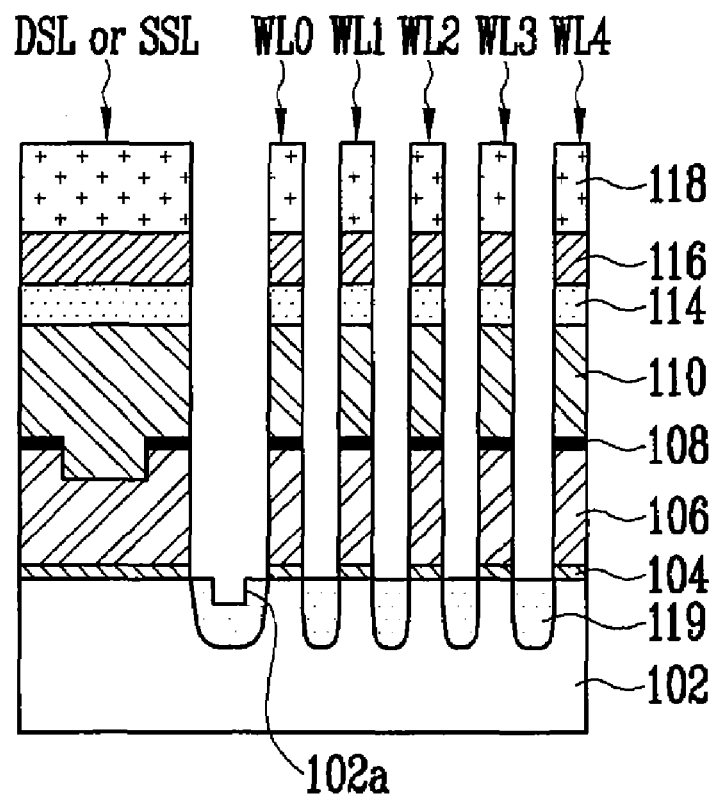

Referring to FIG. 1G, after the dielectric layer 108 is patterned by the second etch process, the first conductive layer 106 exposed between the dielectric layers 108 is removed by a third etch process. The third etch process may be performed using an isotropic dry etch process. The first conductive layer 106 has a difference in thickness between the area in which the second contact hole (refer to B of FIG. 1E) is formed in the region between the select lines and the word lines and the remaining areas. Thus, the tunnel oxide layer 104 is first exposed in the area in which the second contact hole (refer to B of FIG. 1E) is formed by the process of etching the first conductive layer 106. Accordingly, the exposed tunnel insulating layer 104 may also be removed, and the tunnel insulating layer 104 may partially remain or may be removed, as shown in FIG. 1G, so that trenches 102a may be formed.

If the etch process is excessively performed on the first conductive layer 106 to increase the depth of the trenches 102a, the active area of a low-voltage gate (not shown) of a peri area may be damaged. Accordingly, it is preferred that the etch process be performed on the first conductive layer 106 such that the tunnel insulating layer near the low-voltage gate (not shown) of the peri area is not removed.

Therefore, a select line, including the drain select line DSL or the source select line SSL, and a plurality of word lines WL0, WL1, . . . between the select lines are formed over the semiconductor substrate 102. The number of the plurality of word lines WL0, WL1, . . . is typically 16, 32 or the like, but only five word lines are illustrated, for convenience sake. The trench 102a is formed in the semiconductor substrate 102 between the select line DSL or SSL and the word line WL0 adjacent to the select line DSL or SSL.

Thereafter, an ion implantation process is performed on the semiconductor substrate 102 to form a number of junctions 119 between the select line DSL or SSL and the plurality of word lines WL0, WL1, . . . .

Figure 1H:
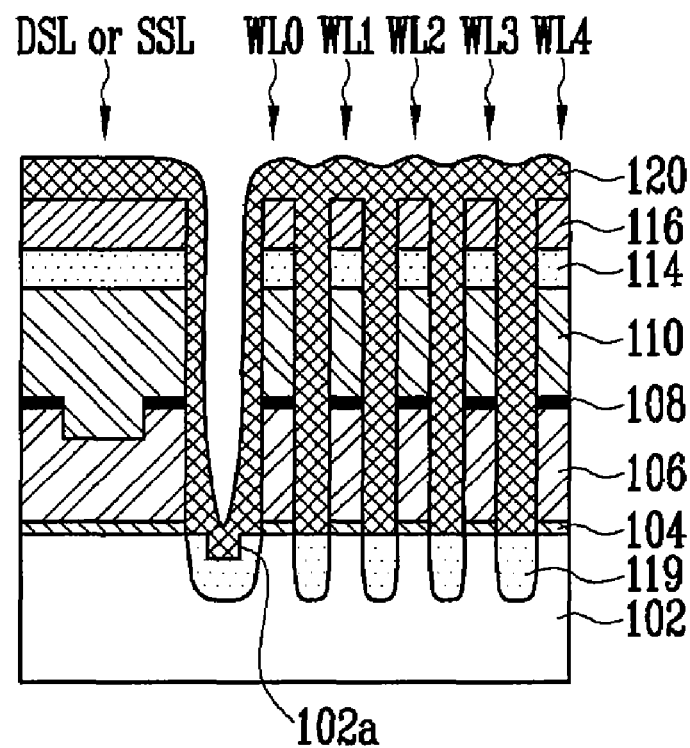

Referring to FIG. 1H, a material layer 120 for a spacer is formed over the semiconductor substrate 102, including the select line DSL or SSL and the plurality of word lines WL0, WL1, . . . . The material layer 120 may be formed on the sidewalls of the select line DSL or SSL. A width between the plurality of word lines WL0, WL1, . . . is narrow and, therefore, is gap-filled with the material layer 120.

Figure 1I:
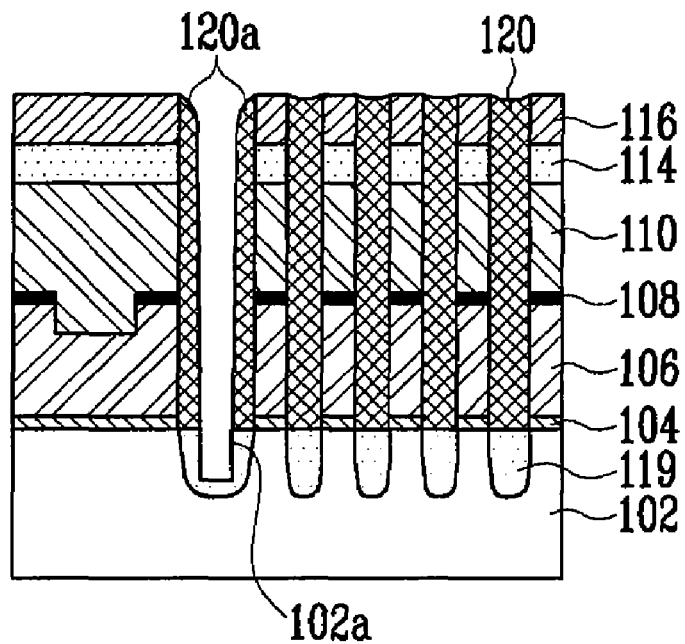

Referring to FIG. 1I, an anisotropic etch process is performed on the material layer 120, thereby forming a spacer 120a on the sidewalls of the select line DSL or SSL. As the material layer 120 is removed, the trench 102a formed on the semiconductor substrate 102 is exposed. The etch process on the material layer 120 may be performed under conditions in which the semiconductor substrate 102 may also be etched, so that the exposed trench 102a may be further deepened about 50 to 200 angstroms. Consequently, the trench 102a can have a final depth of 100 to 300 angstroms.

The etch process of forming the spacer 120a may be performed such that the tunnel insulating layer 104 near a high-voltage gate (not shown) of the peri area remains and the tunnel insulating layer near the low-voltage gate (not shown) is removed.

Accordingly, the trench 102a is formed in the semiconductor substrate 102 between the select line DSL or SSL and an adjacent word line WL0. Thus, a distance that electrons generated by GIDL move up to an adjacent word line may be increased and an electric field by a channel boosting voltage may be mitigated. Consequently, a probability that electrons generated by GIDL serve as hot carriers with respect to an adjacent word line may be reduced significantly, and a program disturbance phenomenon may be precluded.

In order to reduce the program disturbance phenomenon, space between the select line DSL or SSL and a neighboring word line may be increased physically, or a dummy word line, which is not used as a memory cell, but generates program disturbance at the time of a program operation, may be formed in space between the select line DSL or SSL and a neighboring word line. However, this method may increase the size of a string, thereby unnecessarily increasing the size of a memory device.

When the spacer is formed after the gate patterning process is completed, a dual spacer may be formed between the select line DSL or SSL and the word line WL0 adjacent to the select line DSL or SSL. The dual spacer is then patterned, thereby forming the trench in the semiconductor substrate 102 between the select line DSL or SSL and the word line WL0 adjacent to the select line DSL or SSL. However, in this case, a problem arises because a width between the select line DSL or SSL and the word line WL0 adjacent to the select line DSL or SSL is narrow, making etching difficult.

However, if, as in the present invention, a contact hole is further formed in the dielectric layer 108 between the select line DSL or SSL and the word line WL0 adjacent to the select line DSL or SSL during the etch process of the dielectric layer 108 and a typical gate line etch process and spacer formation process are then performed, the trench 102a may be simply formed in the semiconductor substrate 102 between the select line DSL or SSL and the word line WL0 adjacent to the select line DSL or SSL.

According to the method of fabricating a non-volatile memory device in accordance with the present invention, a trench may be easily formed in a semiconductor substrate between a select line and a word line adjacent to the select line. Accordingly, an electron migration path between the select line and the word line adjacent to the select line may be increased and, therefore, a disturbance phenomenon in which an unintentional program operation is generated in the select line and the adjacent word line may be prevented. Consequently, non-volatile memory devices with increased reliability and performance characteristics may be fabricated.

The embodiment disclosed herein has been proposed to allow a person skilled in the art to easily implement the present invention, and the person skilled in the art may implement the present invention in various ways. Therefore, the scope of the present invention is not limited by or to the embodiment as described above, and should be construed to be defined only by the appended claims and their equivalents.

What is claimed is:

1. A method of fabricating a non-volatile memory device, the method comprising:
   providing a semiconductor substrate in which a tunnel insulating layer, a first conductive layer, a dielectric layer and a second conductive layer are formed on an active area;
   forming a contact hole by removing a portion of the second conductive layer and the dielectric layer, wherein the contact hole is formed in an area between a select line and a word line are to be formed;
   forming a third conductive layer over the second conductive layer, wherein the third conductive layer fills the contact hole; and
   patterning the third conductive layer, the second conductive layer, the first conductive layer and the tunnel insulating layer to form a select line and a word line, wherein a trench is formed in the semiconductor substrate between the select line and the word line.

2. The method of claim 1, wherein the trench has a depth ranging from 100 to 300 angstroms.

3. The method of claim 1, further comprising forming another contact hole in an area of the to-be-formed select line, wherein the another contact hole is formed before forming the said contact hole.

4. The method of claim 1, wherein the patterning process comprises:
   etching the third conductive layer, second conductive layer, and dielectric layer using a first etch process to expose a portion of the dielectric layer and the first conductive layer;
   etching the exposed portion of the dielectric layer and the first conductive layer using a second etch process to expose a portion of the tunnel insulating layer; and
   etching the exposed portion of the first conductive layer, the tunnel insulating layer, and the semiconductor substrate using a third etch process to form the trench in the semiconductor substrate in an area corresponding to the contact hole.

5. The method of claim 4, wherein the first etch process is performed to etch the dielectric layer less than the second conductive layer.

6. The method of claim 4, wherein the first etch process is performed using an etch selectivity of the second conductive layer relative to the dielectric layer, wherein the etch selectivity ranges from 5:1 to 20:1.

7. The method of claim 4, wherein the first etch process removes the first conductive layer exposed below the contact hole.

8. The method of claim 4, wherein a thickness of the first conductive layer remaining below the contact hole after the first etch process is 0 to 70% of a total thickness of the first conductive layer.

9. The method of claim 4, wherein the tunnel insulating layer formed below the first conductive layer is exposed by the second etch process.

10. The method of claim 4, wherein the second etch process is performed using an etch selectivity of the first conductive layer relative to the dielectric layer, wherein the etch selectivity ranges from 1:1 to 1.5:1.

11. The method of claim 4, further comprising performing an ion implantation process on the semiconductor substrate between the select line and the word line, wherein the word line is formed after the third etch process.

12. The method of claim 4, further comprising:
   forming a spacer material layer between the select line and the word line, wherein the word line is formed after the third etch process; and
   etching the spacer material layer to form a spacer on sidewalls of the select line.

13. The method of claim 12, wherein in the process of etching the spacer material layer, a depth of the trench is increased by 50 to 200 angstroms.

* * * * *